(12) United States Patent
Härle

(10) Patent No.: US 7,446,346 B2
(45) Date of Patent: Nov. 4, 2008

(54) SEMICONDUCTOR SUBSTRATE FOR OPTOELECTRONIC COMPONENTS AND METHOD FOR FABRICATING IT

(75) Inventor: Volker Härle, Laaber (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 10/770,698

(22) Filed: Feb. 2, 2004

(65) Prior Publication Data

US 2004/0169179 A1    Sep. 2, 2004

(30) Foreign Application Priority Data

Jan. 31, 2003   (DE) ............................. 103 03 967
Feb. 27, 2003   (DE) ............................. 103 08 646

(51) Int. Cl.
    *H01L 33/00*    (2006.01)
(52) U.S. Cl. .................... 257/98; 257/101; 257/436; 257/E29.277
(58) Field of Classification Search ........... 257/79–103, 257/436; 438/36, 48, 455, 35
    See application file for complete search history.

(56) References Cited

U.S. PATENT DOCUMENTS

| | | | |
|---|---|---|---|
| 5,103,271 A * | 4/1992 | Izumiya et al. ............... 257/94 |
| 5,376,580 A | 12/1994 | Kish et al. | |
| 5,862,167 A * | 1/1999 | Sassa et al. .................... 372/45 |
| 6,153,444 A * | 11/2000 | Nakano et al. ................ 438/16 |
| 6,160,867 A * | 12/2000 | Murakami .................... 378/84 |
| 6,255,681 B1 | 7/2001 | Pan | |
| 6,607,931 B2 | 8/2003 | Streubel | |
| 2001/0042866 A1 | 11/2001 | Coman et al. | |
| 2003/0043382 A1* | 3/2003 | Borden et al. ............... 356/502 |

FOREIGN PATENT DOCUMENTS

| | | |
|---|---|---|
| DE | 44 40 072 C1 | 2/1996 |
| DE | 100 00 088 A1 | 8/2000 |
| DE | 100 08 583 A1 | 9/2001 |

* cited by examiner

*Primary Examiner*—Wai-Sing Louie
(74) *Attorney, Agent, or Firm*—Cohen Pontani Lieberman & Pavane LLP

(57) ABSTRACT

In a semiconductor substrate (1), impurity material, for example a metal, is distributed in a layer-like zone (3) in such a way that said zone reflects radiation (6), which is generated or detected by an optoelectronic component, for example. Said layer-like zone (3) is fabricated by implantation of the impurity material into the substrate (1) and subsequent heat treatment for crystallization of the impurity material. Such a substrate is suitable in particular for avoiding the penetration of radiation (6), which is generated for example by radiation-emitting structures (5) applied to the substrate, by reflection in a region of the substrate (1) near the surface and thus for reducing the absorption losses.

6 Claims, 2 Drawing Sheets

SEMICONDUCTOR SUBSTRATE FOR OPTOELECTRONIC COMPONENTS AND METHOD FOR FABRICATING IT

RELATED APPLICATION

This patent application claims the priority of German patent applications 10308646.3-33 and 10303967.8-11, the disclosure content of which is hereby incorporated by reference.

FIELD OF THE INVENTION

The invention relates to a semiconductor substrate for optoelectronic components and a method for fabricating it.

BACKGROUND OF THE INVENTION

In some radiation-emitting optical components, in particular in high-efficiency LEDs there is the problem that the light generated in the radiation-emitting structures is radiated in all spatial directions and thus also in the direction of the substrate, for which reason a large part of the light is lost in the case where absorbent substrates are used. This problem can be avoided by using transparent substrates. However, the disadvantages of some transparent substrates are that they have only a low electrical conductivity and/or an epitaxial deposition of the radiation-emitting structures is not possible owing to a lack of lattice matching. The problem of the lack of lattice matching for the deposition of epitaxial layers also occurs if absorbent semiconductor substrates are mirror-coated by the application of thin layers, for example of metal layers, at their top side in order to prevent the emitted radiation from penetrating into the substrate.

One possibility for avoiding this problem is disclosed in U.S. Pat. No. 5,376,580. In the method described therein, a radiation-emitting LED structure is firstly grown epitaxially on a lattice-matched growth substrate, then separated from the absorbent substrate and connected by means of wafer bonding to a substrate which has good electrical conductivity and is optically transparent to the relevant radiation. In this known method, however, the epitaxially grown LED structure, the electrical and optical properties of which, as is known, depends to a considerable extent on the crystal quality of the epitaxial layers, is subjected, during the separation of the absorbent substrate, to additional mechanical (for example grinding, polishing, etc.) and/or chemical method steps (for example etching), which may lead to damage to said structure.

A method for fabricating an optically transparent substrate onto which a semiconductor substrate can be grown epitaxially, and in which mechanical and/or chemical loading on the epitaxially grown semiconductor structure is avoided to the greatest possible extent, is specified in DE 100 08 583 A1. In the method described therein, firstly a substrate layer is grown on a lattice-matched substrate. The substrate layer is connected to the transparent substrate by means of wafer bonding on the side remote from the lattice-matched substrate. Afterward, the lattice-matched substrate is removed from the connection formed by substrate layer and transparent substrate and the radiation-emitting semiconductor structure is grown epitaxially onto the uncovered side of the substrate layer.

However, the known methods, in which the original provisional substrate is stripped away, require a comparatively high technical outlay. Moreover, transparent substrates are in some instances significantly more expensive than absorbent semiconductor substrates, so that the use of absorbent substrates may often be economically advantageous.

SUMMARY OF THE INVENTION

One object of the present invention is to provide an improved semiconductor substrate, in particular for optoelectronic components, which reflects impinging radiation and thus prevents the absorption of penetrating radiation.

Another object of the present invention is to provide a method for fabricating such a semiconductor substrate, preferably based on a cost-effective absorbent substrate.

This and other objects are attained in accordance with one aspect of the present invention directed to a semiconductor substrate wherein a reflective layer-like zone is formed in the semiconductor substrate. The zone contains impurity material which is introduced into the semiconductor substrate and distributed in layer-like fashion there.

In particular, the reflective layer-like zone is preferably fabricated by implantation of the impurity material into the semiconductor substrate.

In order to ensure a high reflectivity, a metal, in particular aluminum or silver, is preferably used as the impurity material.

The semiconductor substrate may be any desired substrate which is suitable for the fabrication of semiconductor chips and which may contain, in particular, silicon, silicon carbide or a III-V semiconductor material.

Another aspect of the present invention is directed to a method for fabricating a semiconductor substrate with a reflective layer-like zone containing impurity material which is introduced into the semiconductor substrate, wherein the impurity material is implanted into the substrate.

Preferably, the substrate is subsequently subjected to heat treatment for at least partial crystallization or even for formation of a monocrystalline layer of the impurity material, at a temperature $T_2$.

The temperature $T_2$ required for the at least partial crystallization of the impurity material is material-dependent and, for aluminum, for example, has a value of 200° C. to 1000° C., preferably about 350° C.

In one embodiment of the invention, a layer-like zone containing silicon carbide is fabricated in a first method step. For this purpose, carbon is implanted into the silicon substrate. The substrate is subsequently subjected to heat treatment in order to produce a layer-like zone containing silicon carbide at a temperature $T_1$ of 500° C. to 2000° C., preferably at about 1000° C. The heat treatment is preferably effected under Si partial pressure.

The impurity material serving for forming the reflective layer-like zone is subsequently implanted into a region of the semiconductor substrate which lies below the layer-like zone containing silicon carbide. This is followed by a further heat treatment step for at least partial crystallization of the impurity material.

Preferably, after the implantation of the impurity material, a silicon layer remaining above the layer-like zone containing silicon carbide is stripped away or removed. The silicon layer may be etched away wet-chemically, for example, the silicon layer preferably being bombarded with high-energy ions prior to etching in order to make it amorphous.

BRIEF DESCRIPTION OF THE DRAWINGS

The invention is explained in more detail below using two exemplary embodiments in connection with the drawings, in which.

DETAILED DESCRIPTION OF THE DRAWINGS

Figure 1A:
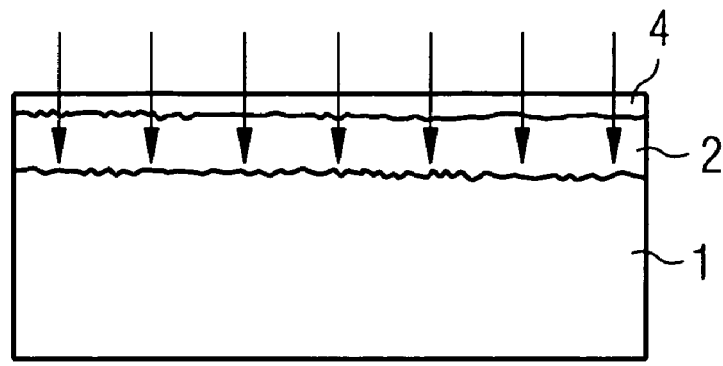
FIGS. 1A to 1C diagrammatically show an exemplary embodiment of a fabrication method according to the invention and, in FIG 1c, an exemplary embodiment of a semiconductor substrate according to the invention.

FIG. 1A shows a semiconductor substrate 1, which may be, by way of example, silicon (Si), silicon carbide (SiC) or a III-V semiconductor, e.g. GaAs. A layer-like zone 2 containing impurity material is implanted into the semiconductor substrate 1. The impurity material is preferably a metal, particularly preferably aluminum or silver.

The thickness of the layer-like zone 2 is in the range of 10 nm to 100 nm. The implantation depth can be up to a few microns, but should be as small as possible since the aim of the invention is to minimize absorption by the substrate between the surface of the substrate and the layer-like zone 2. The impurity concentration should be as high as possible to achieve a high reflection. However, the invention is not restricted to any impurity concentration nor is it restricted to use of implantation for introducing the impurity material into the substrate, since other methods are known to a person with ordinary skill in the art.

Figure 1B:
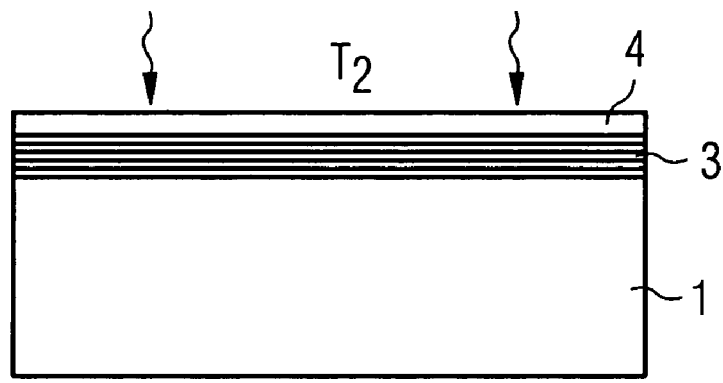

By means of a heat treatment step illustrated diagrammatically in FIG. 1B, the polycrystalline layer-like zone 2 containing impurity material can be converted at least into an at least partly crystalline, or even monocrystalline, layer-like zone 3. A thin layer 4 made of the basic material of the semiconductor substrate 1 remains above the layer 3 containing impurity material.

Figure 1C:
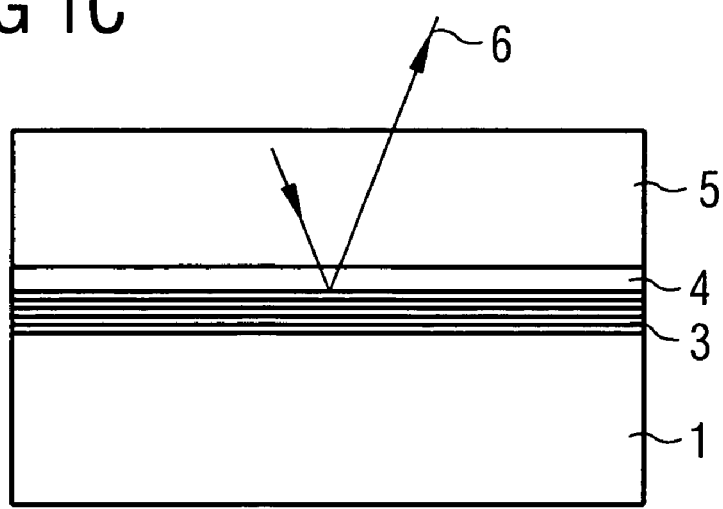

As is illustrated diagrammatically in FIG. 1C, by way of example, the semiconductor substrate 1 modified in this way has a radiation-emitting layer sequence 5 applied to it, for example by epitaxial growth. By way of example, the radiation-emitting layer sequence 5 may contain nitride compound semiconductors. In this case, a nitride compound semiconductor is understood to be a nitride compound of elements of the third and/or fifth main group, in particular GaN, AlGaN, InGaN, AlInGaN, AlN or InN.

The radiation emitted by the layer sequence 5 in the direction of the semiconductor substrate 1 is reflected at the layer-like zone 3 containing impurity material. The layer 4 which remains above the layer-like zone 3 containing impurity material and is made of the basic material of the semiconductor substrate 1 should therefore be thin enough that the absorption of the radiation emitted by the radiation-emitting layer 5 is negligibly small.

Figure 2A:
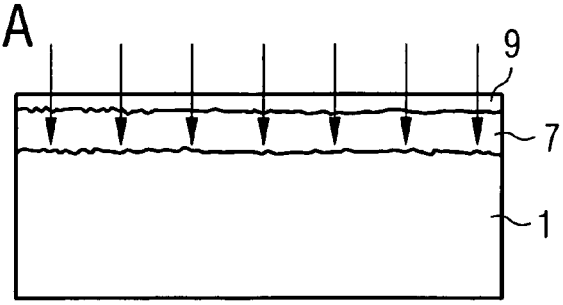
FIGS. 2A to 2E diagrammatically show an exemplary embodiment of a fabrication method according to the invention and, in FIG. 2e, an exemplary embodiment of a semiconductor substrate according to the invention.

FIG. 2A shows a semiconductor substrate 1 in the form of a silicon substrate. Carbon is implanted into the silicon substrate, for example by means of a thermally decomposable compound such as CO or $CO_2$.

Figure 2B:
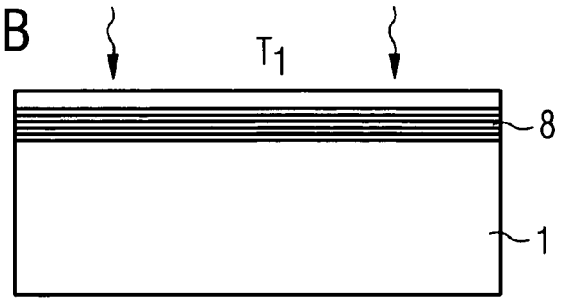

A crystalline SiC layer is produced by means of a heat treatment step illustrated diagrammatically in FIG. 2B. This heat treatment step is carried out a temperature $T_1$ of 500° C. to 2000° C., preferably at about 1000° C.

Figure 2C:
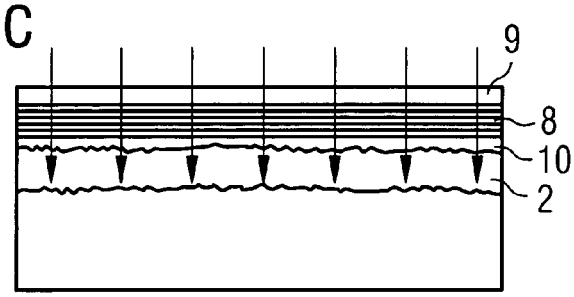

In the subsequent method step illustrated diagrammatically in FIG. 2C, an impurity material, which is preferably a metal, particularly preferably aluminum or silver, is implanted into a region of the semiconductor substrate 1 which lies below the SiC-containing layer-like zone 8. The characteristics of the impurity material in terms of such factors as depth, thickness, concentration and method of introduction can be the same as described above in connection with FIG. 1A.

Figure 2D:
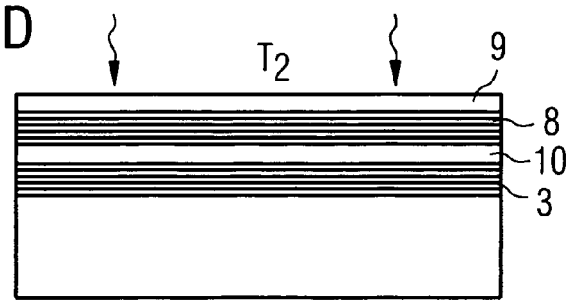

The polycrystalline layer of the impurity material 2 that is produced in this way is converted into an at least partly crystalline, or even monocrystalline, layer-like zone 3 by means of a heat treatment step illustrated diagrammatically in FIG. 2D, at a temperature $T_2$, where $T_2<T_1$. A thin silicon layer 10 having a thickness of up to about 50 nm, may remain between the layer-like zones 3 and 8 which contain the SiC and the impurity material.

The silicon layer 9 remaining above the layer-like zone 8 containing SiC is preferably removed in a subsequent process step. The silicon layer 9 may be removed for example by wet-chemical etching, the silicon layer 9 preferably being made amorphous beforehand through bombardment with high-energy ions. A so-called "smart-cut" process is likewise suitable, in which microcracks are produced by hydrogen implantation and a subsequent heat treatment and the silicon layer 9 can be stripped away along said microcracks.

The implantation of the SiC layer 8 into the semiconductor substrate 1 made of silicon is done to provide a substrate that can be used for epitaxial growth of materials which can be grown on a SiC surface but not on a silicon surface due to a lattice mismatch, such as III-V-nitride semiconductors. By implantation of C into the silicon substrate, annealing for crystallization, and removal of silicon layer 9 that remains above the SiC layer, a substrate with a SiC surface is made from the silicon substrate. A light emitting layer sequence can be grown on this substrate, as discussed below in connection with FIG. 2E. By this method, an inexpensive silicon substrate is "converted" to a substrate having the surface structure of SiC. This is advantageous because real SiC substrates are expensive and/or only available in small sizes.

Figure 2E:
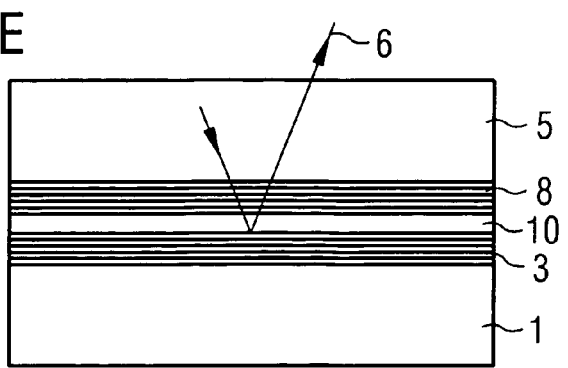

As illustrated by way of example in FIG. 2E, the semiconductor substrate 1 modified in this way may have a radiation-emitting layer sequence 5 applied to it, for example by epitaxial deposition. The radiation 6 emitted by the radiation-emitting layer sequence 5 can penetrate through the partly crystalline layer-like zone 8 containing SiC and a silicon layer 10 situated above the layer-like zone 3 containing the impurity material and is thereupon reflected at the layer-like zone 3 containing the impurity material. The absorption losses of the radiation 6 emitted in the direction of the semiconductor substrate 1 are thereby considerably reduced compared with a conventional absorbent semiconductor substrate.

As an alternative, the semiconductor substrate 1 according to the invention may also serve as a carrier for an LED originally fabricated on another substrate. By way of example, an LED fabricated on a sapphire substrate may be applied to a semiconductor substrate 1 according to the invention by means of a transparent, advantageously conductive, connection. The sapphire substrate is then separated nondestructively, for example by means of a laser stripping process. This is advantageous from an economic standpoint because the expensive sapphire substrate can be reused.

The scope of protection of the invention is not restricted by the description of the invention on the basis of the exemplary embodiments. Rather, the invention encompasses any new feature and also any combination of features, which in particular comprises any combination of features in the patent claims, even if said combination is not specified explicitly in the patent claims.

I claim:

1. A radiation-emitting optical component, comprising:
   a semiconductor substrate having a reflective layer-like zone formed therein with impurity material distributed in layer like fashion, said impurity material being implanted into the semiconductor substrate; and a radiation-emitting semiconductor layer sequence applied on said semiconductor substrate.

2. The radiation-emitting optical component as claimed in claim 1, wherein the impurity material is a metal.

3. The radiation-emitting optical component as claimed in claim 2, wherein the metal is aluminum or silver.

4. The radiation-emitting optical component as claimed in claim 1, wherein the semiconductor substrate contains silicon, silicon carbide, germanium or a III-V semiconductor material.

5. The radiation-emitting optical component as claimed in claim 1, wherein the impurity material is a metal.

6. The radiation-emitting optical component as claimed in claim 1, wherein said semiconductor layer sequence comprises a nitride compound semiconductor.

* * * * *